United States Patent

Maier

[11] Patent Number: 5,875,319
[45] Date of Patent: *Feb. 23, 1999

[54] METHOD FOR AUTOMATICALLY MODELING A SUBPROCESS FROM AN OVERALL PROCESS BY MEANS OF A COMPUTER

[75] Inventor: Rupert Maier, Eggolsheim, Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 640,961
[22] PCT Filed: Nov. 10, 1994
[86] PCT No.: PCT/DE94/01326
  § 371 Date: May 10, 1996
  § 102(e) Date: May 10, 1996
[87] PCT Pub. No.: WO95/14281
  PCT Pub. Date: May 26, 1995

[30] Foreign Application Priority Data

Nov. 15, 1993 [DE] Germany ............. 43 38 989.9

[51] Int. Cl.⁶ .................................................. G06F 17/50
[52] U.S. Cl. .................. 395/500; 395/680; 395/683; 707/100; 707/102; 707/200; 364/578
[58] Field of Search ................... 395/500, 156, 395/157, 800, 611, 670, 601, 604, 683, 701; 364/225, DIG. 1, 578; 707/200, 203, 100, 101, 103, 102; 398/680; 705/7

[56] References Cited

U.S. PATENT DOCUMENTS 5,195,178  3/1993  Krieger et al. ............ 395/157
5,241,645  8/1993  Cimral et al. ............ 395/500
5,249,300  9/1993  Bachman et al. ........ 395/800

FOREIGN PATENT DOCUMENTS

WO 91/17494  11/1991  WIPO .

OTHER PUBLICATIONS

IBM Systems Journal, vol. 32, No. 3, (1993), Saracelli et al, Process Automation In Software Application Development, pp. 376–396.

Proceedings Fifth International Workshop on Computer–Aided Software Engineering, 6 Jul. 1992, Heym et al, A Semantic Data Model For Methodology Engineering, pp. 142–155.

Primary Examiner—Kevin J. Teska
Assistant Examiner—Thai Phan
Attorney, Agent, or Firm—Hill & Simpson

[57] ABSTRACT

The invention describes a method by means of which a specific subset can be filtered out as subprocesses from an overall process. The partial results of the overall process are provided for this purpose with specific attributes which are intended to be characteristic in the case of application of the method according to the invention for modeling subprocesses. The procedure is the same with the activities, which hereby obtain attributes specific to the modeling. This produces an overall network plan of the process, which is composed of partial results and subactivities, which in turn are provided in each case with activity attributes and result attributes. When the method according to the invention is used, the computer is prescribed activity attributes and/or result attributes, which can optionally be logically combined with one another, or else only selected for themselves. The method according to the invention filters out the relevant activities and partial results from the overall process and represents their logical combinations graphically so that even very complex overall processes can be represented clearly and, above all, in a very concretely specific fashion as regards an interest.

8 Claims, 4 Drawing Sheets

FIG 1

PART A
ACTIVITY ATTRIBUTES

Relation to project
. . . . .
Constellation
    is part of
        n ..... 1
        1 ..... n
Creator Internal
    Project management
    Mechanical engineering
    System engineering
    ZN / LG
    Internal viewing system
    . . .

External
        Customer
        Subsupplier
Tool
    Workstation
        Mentor
        . . .
    PC
        AutoCAD
        WinWord
        Excel
        MS-Project

PART B
RESULT ATTRIBUTES

Data
    Paper
        List
        Report
        Description
        Plan
        Catalog
    DP Hard disk WinWord format
            dBase format Diskette
        Network
Owner
    Internal
        Project management
        Mechanical engineering
        System engineering
        ZN/LG
        Internal viewing system
        . . .

External

Customer
        Subsupplier

Phase
    Tender
    Planning
    . . .
    Designing
    Internal viewing system

METHOD FOR AUTOMATICALLY MODELING A SUBPROCESS FROM AN OVERALL PROCESS BY MEANS OF A COMPUTER Engineering processes (for example project planning processes) are becoming ever more complex and unclear. In order, nevertheless, for them to be defined and optimized effectively, modeling is being employed in an ever greater extent. The method respectively used must in this case solve the following problems:

mastering the complexity adapting the model to different problem formulations comprehensibility of the models for all participants (appropriate representation of the complex to be optimized).

The individual parts, which are to be modeled, of the model have a multiplicity of properties which have to be taken into account in defining or optimizing the process (for example tools and aids employed, throughput times, responsibilities/executives, connections between the individual process elements, users, . . . ).

As a rule, a plurality of different departments, tools and methods participate in such complex processes or in their optimization. For example, up to 15,000 documents are produced in the project planning of gas-fired and steam-driven power plants. Participating in the creation are, for example, the most varied groups/persons, such as the project leader, designers in instrumentation and control technology and in structural engineering, but also tooling developers or those responsible for costs. Because of the different emphases of interest, the participating groups have different problem formulations relating to individual details of the process. Exchanging the type of a cooling circuit pump during a project planning process gives rise, for example, to the following problems:

How do the costs develop, taking account of all the follow-up activities? Or: which structural changes are thereby necessary? Depending on the emphasis of interest and the range of tasks of the individual groups, further different problem formulations arise which have to be answered by a process model and represented clearly and comprehensibly for all participants.

At present, there are point-by-point approaches to solutions (isolated solutions) for optimizing individual parts of engineering processes. Nevertheless, the segments of the processes are always very complex, with the result that the overview can be lost very quickly without suitable structuring. However, it is precisely the possibilities of flexible structuring accompanied by the use of changing requirements which are not provided in the case of previously available tools and modeling possibilities. Consequently, mastering the overall complexity when engineering large systems also presents ever greater difficulties, but so too do large system developments. Particularly difficult in this regard is detecting or optimizing the flow of information which is required between the individual participants. Modeling possibilities known to date are structured analysis, representation in entity relationship models, or SDL models. In order to be able to master the complexity of an engineering process, in the current methods, for example, an important property/parameter (for example the functional dependencies) of the parts to be modeled is extracted. A rigid hierarchy is constructed in accordance with this parameter, and the model is structured in accordance therewith. This mode of procedure has, however, the consequence that relationships which would arise when taking account of other parameters are not sufficiently taken into account. Again the required structure is not known in every case at the start of modeling. Thus, the first step is to collect material and only subsequently to find a hierarchy tree in a plurality of iteration steps. Once found and taken as a basis, this hierarchy structure is rigid and permits only a few problem formulations to be answered. Information for answering further problem formulations is either distributed over the entire model or not contained in the model, since there is no backup for rationally entering data or reading it out again, or for being able to extend the model. A further problem is the comprehensibility of the models of the individual respective modeling methods. The approaches to date are very strongly designed for individuals concerned (for example developers and DP experts).

However, further persons, such as project leaders, decision makers and outsiders, generally participate in the definition and optimization of the process. For these circles of persons, the models are not comprehensible enough and answer their questions only unsatisfactorily; they therefore find only conditional acceptance.

The object on which the invention is based is to specify a method by means of which, as a function of a special problem formulation, it is possible automatically to generate a process model from an overall model and to incorporate changes in this submodel into the overall model.

This object is achieved in accordance with the features of patent claim 1.

Developments of the invention emerge from the subclaims.

A great advantage of the method according to the invention is the use of only two basic elements for modeling even complex overall processes. As a result, the overall process is represented in great detail, but this also has the effect that the automatically modeled subprocess is very easy to comprehend, contains only the required information and can be vividly represented. The different problem formulations of the individuals participating in the process are rendered possible in an advantageous way by assigning attributes to results and activities, the model components. Thus, it is possible in an advantageous way automatically to model a very special subprocess, which takes account only of the special problems, from a complex overall process as a function of the most varied, previously input attributes.

In the method according to the invention, a plurality of partial results, which supply the preconditions for a subactivity, are advantageously combined in an information node. This favors the clarity of the automatically modeled process.

It is favorably achieved as a result of the logical combination of individual attributes with one another that even very complex relationships can be filtered out of an overall process, and can be represented in a modeled subprocess.

It can advantageously be achieved by means of the representation according to the invention of attributes as numbers and texts that, for example, even investigations into throughput time, or cost analyses can play a role in modeling a subprocess.

For modeling the overall process, it is favorably achieved with the selectable prescription of attributes that the consistency of the overall process model is maintained. The point is that it is, for example, conceivable that individual departments participating in the overall process model their field separately, and that these individual models are assembled to form an overall process.

It can advantageously be achieved by means of the hierarchical ordering of the attributes that automatically modeled processes can be even more accurately directed towards a problem formulation without thereby impairing clarity.

The representation of results as marked surfaces, and of activities as arrows favors the clarity of the automatically created subprocess.

The invention is explained further below with the aid of figures, in which

FIG. 1 shows, in this regard, examples of result and activity attributes,

Figure 2:
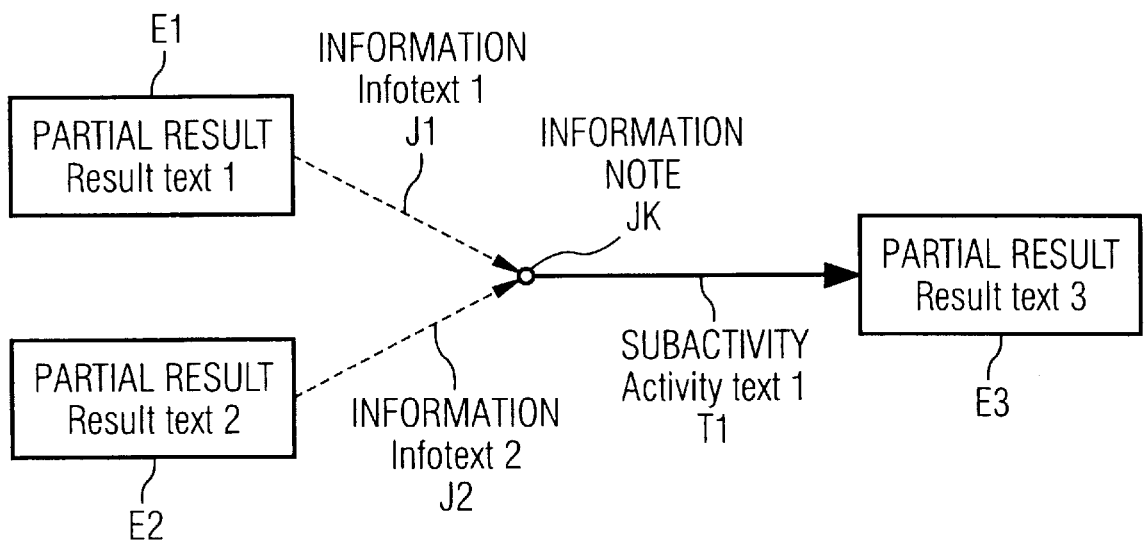
FIG. 2 shows an example of an information node.

Hierarchically classified examples of activity attributes and result attributes are represented in FIG. 1. Here, FIG. 1a shows the activity attributes, and FIG. 1b the result attributes. These features can, for example, be stored in structure trees for the following reasons:

The modeler has structured the features in accordance with criteria which appear important to him.

The structure facilitates finding the individual features in creating the model, or during automatic modeling of the subprocess.

An affinity between result and activity attributes can be represented in the structure by related attributes being located in the corresponding branches of a structure tree.

For example, such attribute trees can be defined and modified before or during creation of the model. In the case of definition, it is also possible, for example, to stipulate how many text attributes are to be selected from the individual trees per result or activity. The following possibilities can be provided in this regard:

1. Precisely one element of the tree (for example in the case of the attribute tree of the filing format of a result).
2. At most one element of the tree.
3. At least one element of the tree (for example in the case of the attribute tree of the "performers" of an activity).
4. Arbitrarily many elements (for example "tools used" in performing an activity).

It can also be provided that a plausibility test is conducted for parts of an overall model which are to be input anew or which change. It can be checked, for example, in this connection whether the results and activities have been assigned the required attributes. In the case of changing or recreating attribute trees, a plausibility test is also required, for example, for model parts already input. Activity attributes can, for example, be implicitly combined. In this case, for example, the deepest branching points of a tree are indicated as attributes of the activity under which all the selected attributes of a tree are subsumed. It can also be provided implicitly to combine result attributes when results are combined with reference to an AND group. For example, all the attributes which additionally characterize those results can be combined in a tree structure. However, the tree structure has no influence on a logic OR operation of attributes. Different activity attributes, such as "relation to project" and "constellation", are represented, for example, in FIG. 1a. Subattributes of "constellation" are "is part of" and, furthermore, "creator". If this creator is "internal", where is the creator located in organizational terms? Is he "external"? For example, a further branching point of the attribute tree is "tool", whose subattribute is "workstation", a "tool" being represented in turn by "mentor" as a subattribute. A further subattribute of "tool" can also be "PC", on which corresponding software can be executed as subattribute.

FIG. 1b shows examples of result attributes. For example, a result attribute can be "data". These data can subbranch into "paper" or "data processing", it being possible for paper to subbranch in turn into "lists", "reports", "descriptions", "plans" and "catalogs", and for "data processing" to subbranch further into a "hard disk" which can be described in different formats. For example, there is also a "diskette" or a network as subattribute of "DP". Furthermore, "owner" is, for example, a result attribute which can be located "internally" or "externally". Furthermore, it is also possible, for example, to provide a "project phase" as result attribute, it being possible for this to be split down into "tender", "planning phase" and "design phase".

The attribute trees presented are to be regarded only as examples. A sensible choice of attributes is to be prescribed as a function of the dependence of an overall process, and to be used in modeling. Subsequently, a subprocess can be automatically modeled as a function of the prescribed attributes. FIG. 2 shows by way of example how the method according to the invention can be used to represent information which accrue in partial results and are a precondition for a subactivity.

Represented in FIG. 2 are three partial results which are denoted by E1 to E3. Furthermore, an information node IK and text information E1 and E2 can be seen. A subactivity T1 goes from the information node IK to the result E3.

Since according to the definition of the method according to the invention only results concerning activities are converted into results, the method according to the invention favorably provides that if a plurality of results provide information which is a basis for a subactivity, this information is extracted from the results; here, for example, I1 and I2 from the results E2 and E1. This information is then combined in an information node which then counts in practice as the result in the sense of the method according to the invention and is converted from a subactivity, here T1, into a further partial result of the method according to the invention. This partial result is denoted by E3 in FIG. 2.

Figure 3:
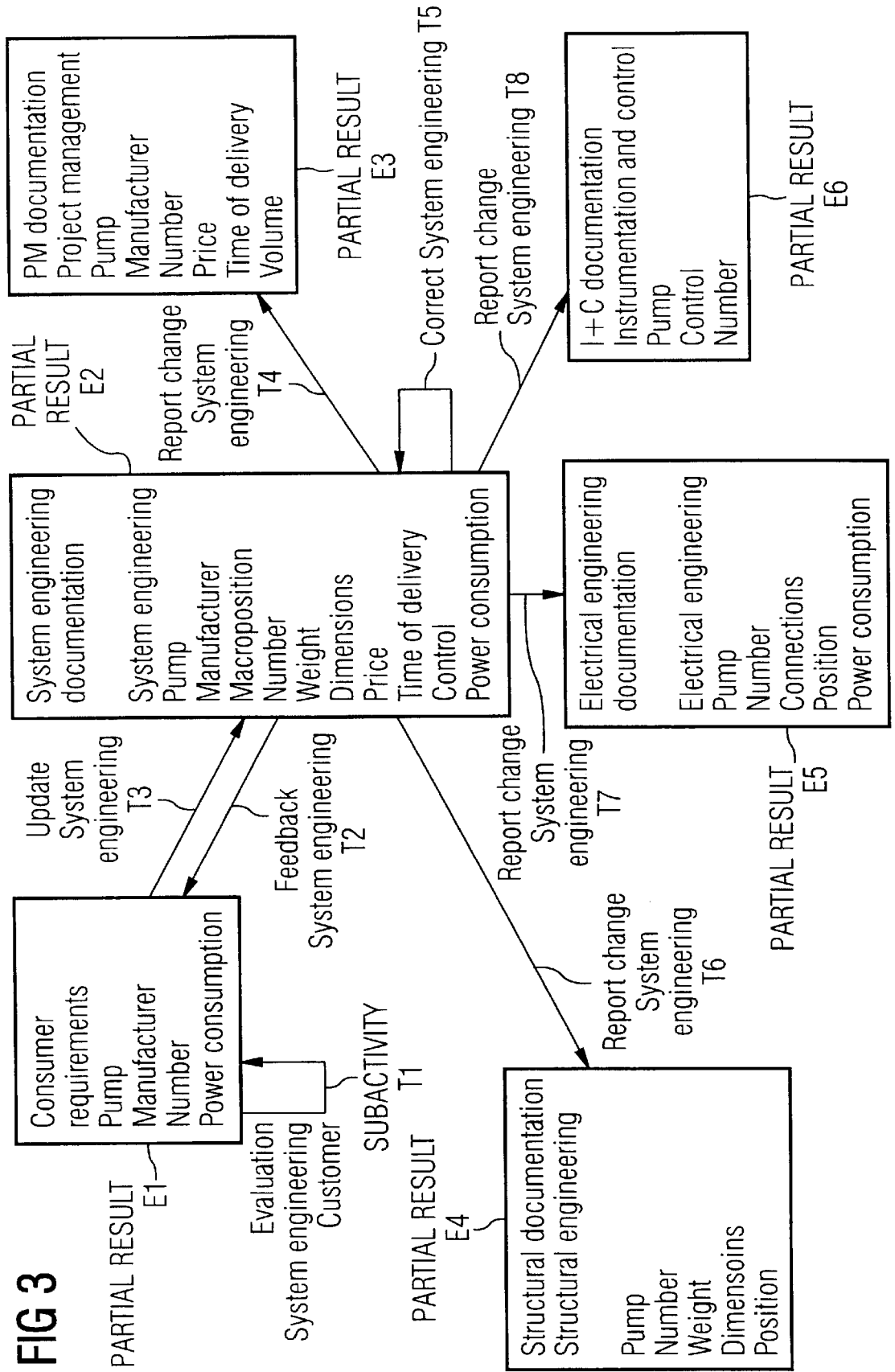
FIG. 3 shows an example of an automatically modeled subprocess.

FIG. 3 shows a subprocess which is generated automatically in accordance with the method according to the invention. The partial results are represented in FIG. 3 in rectangles which are denoted by E1 to E6. These individual rectangles or partial results are converted into one another via subactivities T1 to T8. FIG. 3 is based on the following initial situation. Here, it is to be established, for example, which departments or which production processes are affected thereby if it is established during the production process that a specific pump model cannot be treated optimally, and that therefore a different pump type must be selected. The organizational department which takes this decision is system engineering. As input for the method according to the invention, the result attributes of system engineering and pump are input, logically combined, into the computer.

Furthermore, the activity attribute of system engineering is now selected in order to be able to establish which activities of system engineering are required in order to communicate the change in pump type to those affected.

Firstly, the relevant change must be evaluated from the customer's point of view. This is performed in E1 by means of the activity T1. Subsequently, a report is made to the system engineering T3 that another pump model is to be used. The corresponding pump model is then corrected in E2 via the activity T5, and there is feedback T2 to the customer requirements E1. E2 then initiates the activity T4, which causes a change in the project documents in E3. Furthermore, the changed pump model is communicated via T6 to the structural documentation, which is located in E4. Likewise, the electrical engineering documents E5 are to be changed via T7, and the instrumentation and control documentation, that is to say the time scheduling, is to be corrected via T8 in E6.

This subprocess is generated as an AND operation automatically from an overall process in a method according to the invention on the basis of the input attributes of system engineering and pump. Thus, the method according to the invention automatically ensures the consistency of the production process, and a high degree of clarity is preserved.

Figure 4:
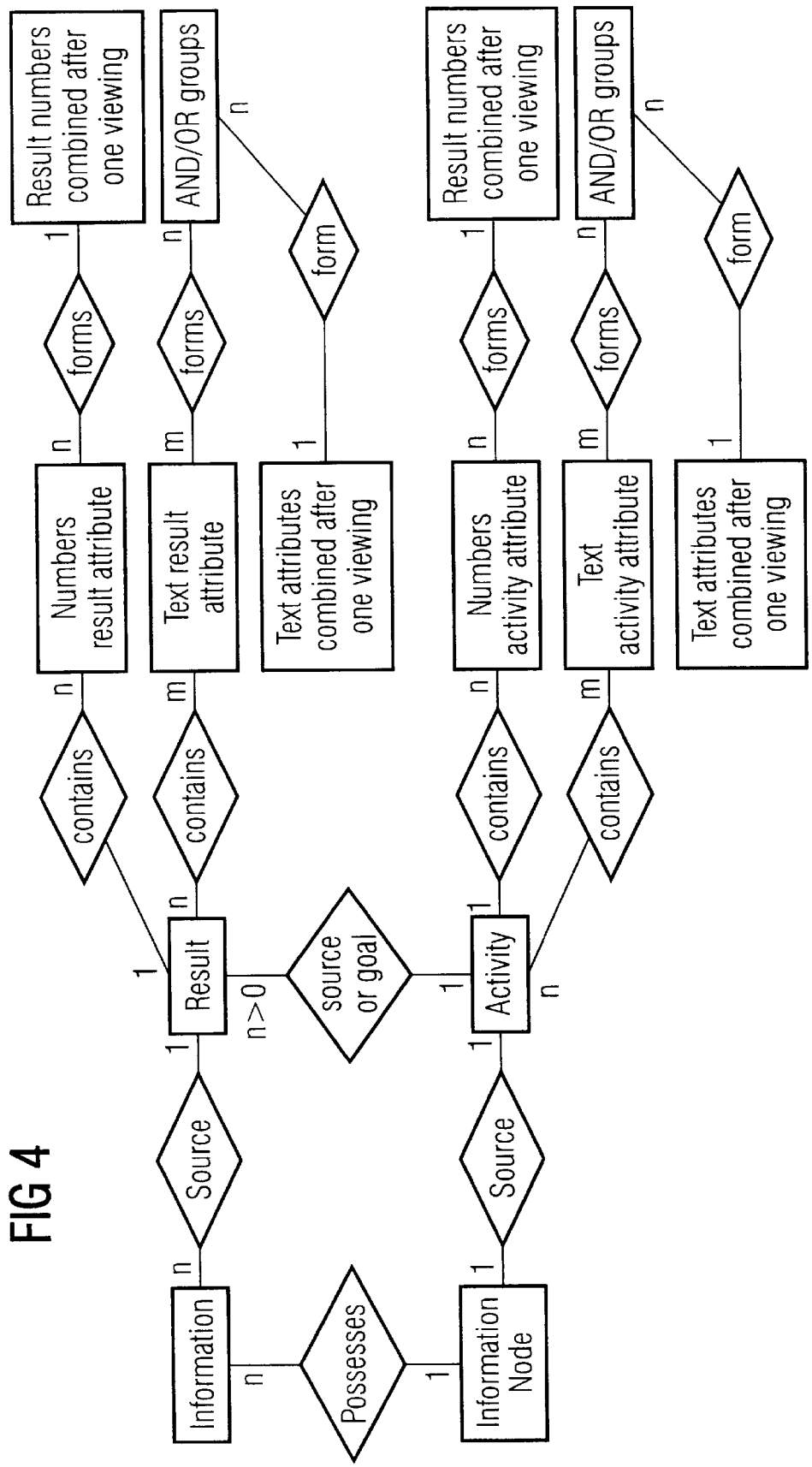
FIG. 4 shows an example of an entity relationship model for the method according to the invention.

FIG. 4 shows the entity relationship model of the method according to the invention (dependencies in data systems technology) as an example. It is to be read from left to right and is formulated in accordance with the known standard (Peter Chen: The Entity-Relationship Model, Toward a Unified View of Data, ACM Transactions on Database Systems, Vol. 1, 1976).

I claim:

1. A method for automatically modeling a subprocess from an overall process using a computer, comprising the steps of:

providing a modeled overall process having results and activities;

using, for modeling the overall process, only a portion of the results and activities of the overall process;

providing a subactivity with at least one activity attribute;

providing a partial result of said partial results of said overall processing with at least one result attribute;

converting two partial results into one another using a subactivity; and modeling the subprocess using the computer, as a function of at least one activity attribute and/or result attribute, by logically combining activity attributes and/or result attributes for modeling the subprocess.

2. The method as claimed in claim 1, in which if a plurality of partial results (E1, E2) are a precondition for a subactivity (T1), they are combined in an information node (IK) which is then converted into a partial result (E3) by the subactivity (T1).

3. The method as claimed in one of the preceding claims, in which an attribute represents a text or a number.

4. The method as claimed in one of the preceding claims, in which attributes are selectably prescribed for the purpose of modeling the overall process.

5. The method as claimed in claim 4, in which attributes are ordered hierarchically so that a subprocess is modeled more coarsely as a function of a higher-order attribute.

6. The method as claimed in one of claims 4 to 5, in which at least two overall processes, for the modeling of which common attributes have been used, form a new overall process.

7. The method as claimed in one of the preceding claims, in which a partial result (E) is represented graphically by means of a marked surface, and a subactivity (T) is represented graphically by means of a connecting arrow.

8. The method as claimed in claim 7, in which the graphical representation of the modeled subprocess is created automatically with the aid of the marked surfaces, the basic attributes and an available representing surface.

* * * * *